(12) United States Patent
Tasaka

(10) Patent No.: US 6,515,364 B2
(45) Date of Patent: Feb. 4, 2003

(54) SEMICONDUCTOR DEVICE

(75) Inventor: Kazuhiro Tasaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/835,958

(22) Filed: Apr. 10, 2001

(65) Prior Publication Data

US 2001/0030368 A1 Oct. 18, 2001

(30) Foreign Application Priority Data

Apr. 14, 2000 (JP) .......................... 2000-113390

(51) Int. Cl.$^7$ .................. H01L 23/48; H01L 23/52; H01L 29/40
(52) U.S. Cl. ................ 257/758; 257/781; 257/786; 257/784; 438/622
(58) Field of Search ................ 257/341, 758, 257/780, 781, 786, 784, 698; 438/118, 622

(56) References Cited

U.S. PATENT DOCUMENTS

| 5,061,985 A | * | 10/1991 | Meguro et al. ............ 257/68 |
| 5,736,791 A | | 4/1998 | Fujiki et al. |
| 5,847,466 A | * | 12/1998 | Ito et al. ................ 257/758 |
| 5,874,779 A | * | 2/1999 | Matsuno ................. 257/758 |
| 6,046,502 A | * | 4/2000 | Matsuno ................. 257/758 |
| 6,100,589 A | * | 8/2000 | Tanaka .................. 257/758 |
| 6,163,056 A | * | 12/2000 | Mackawa ................ 257/355 |

FOREIGN PATENT DOCUMENTS

| JP | 64-39035 | 2/1989 |
| JP | 01-179434 | 7/1989 |
| JP | 10-247664 | 9/1998 |
| JP | 2964999 | 1/1999 |
| JP | 11-121458 | 4/1999 |

OTHER PUBLICATIONS

Copy of Taiwanese Patent Office dated Jun. 4, 2002 regarding corresponding foreign application.
English translation of above Taiwanese Patent Office Action.
English Bibliographies and Abstracts of JP 64–39035, JP 01–179434, JP 10–247664, JP 11–121458, JP 2964999 (noted above).

* cited by examiner

Primary Examiner—David Nelms
Assistant Examiner—Andy Huynh
(74) Attorney, Agent, or Firm—Darryl G. Walker; Bradley T. Sako

(57) ABSTRACT

A semiconductor device having buried oxide film (11) and a diffusion layer (12) formed in an alternating pattern. A CMP method can be used to create a planar surface. Polycide (13) can be formed on buried oxide film (11). An interlayer film (14) can be formed on buried oxide film (11), diffusion layer (12), and polycide (13). Contact holes (15) can be formed in interlayer layer (12) above polycide. A plug (17) including a barrier layer (16) can be formed in contact holes. A pad electrode (18) can be formed with plugs (17) providing an electrical connection between pad electrode (18) and polycide (13). In this manner, barrier layer (16) and plugs (17) can provide an anchor for the pad electrode (18). Peeling may be prevented when stress is applied to the pad electrode (18) during the bonding process.

7 Claims, 3 Drawing Sheets

SEMICONDUCTOR DEVICE

TECHNICAL FIELD

The present invention relates generally to a semiconductor device and more particularly to a semiconductor device having a pad for use in creating electrical connections with external devices.

BACKGROUND OF THE INVENTION

In order to reduce the chip size of semiconductor devices, minimum device geometries have decreased. As geometries on semiconductor devices have decreased, minimum geometries for metal wirings have been reduced to the submicrometer range. However, a bond wire, used for electrical connection between a semiconductor device and a conducting portion of a lead frame, can have a diameter of 20 to 50 μm. A pad electrode (bond pad) provides a conducting contact surface on the semiconductor device for a bond wire. The pad electrode can form a square conducting layer with each side being about 100 μm in order to provide adequate surface area for the bonding wire contact surface.

In conventional semiconductor devices, the pad electrode can become thinner following the reduced geometries for conductors. However, a thinner pad electrode can be more likely to peel from the semiconductor surface due to impact forces.

For example, in a semiconductor device such as an Static Random Access Memory (SRAM), Dynamic Random Access Memory (DRAM), or Mask Read Only Memory (Mask ROM), an aluminum wiring having a 0.4 μm width can be formed on the semiconductor substrate in order to provide a low resistance conductor to gate electrodes in the memory cells along a word line. It may be desirable to form this aluminum wiring in the same process step as the pad electrode in order to keep the number of process steps low and thus keep manufacturing costs low. However, in order to accurately etch an aluminum wiring having a 0.4 μm width and a 0.4 μm spaced interval, it is desirable that the thickness of the deposited aluminum film to be less than 0.4 μm.

In contrast, in order to prevent the pad electrode from being susceptible to peeling from the semiconductor surface due to impact forces during the bonding process, the thickness of the aluminum film is desired to be at least 0.6 μm. This can make it difficult to reduce the size of the semiconductor device.

A semiconductor device was disclosed in Japanese Patent No. 2964999 ('999) constructed in a manner to improve the adhesion force between a pad electrode and an interlayer insulation film. The semiconductor device in the '999 includes a conductive film formed on a semiconductor substrate, an interlayer film formed on the conductive film, the interlayer film having an opening in which a metal layer is formed. A pad electrode is then formed on the interlayer film.

In the '999, the metal layer formed in the opening of the interlayer film has a height that is slightly lower than the top of the opening. This forms irregularities or unevenness on the interface between the pad electrode and the interlayer film. This can help prevent slippage from occurring at the interface between the pad electrode and the interlayer film. Thus, adhesion may be improved and peeling of the pad electrode can be reduced when the bond wire is bonded to the pad electrode.

In the semiconductor device disclosed in the '1999, a Local Oxidation of Silicon (LOCOS) isolation method of up to 0.24 μm is used to create the interface layer, which is used as a base for the pad electrode. This ensures a flat enough interface layer, which is used as a device isolation area. The conductive film and metal layer can also serve as an anchor for the pad electrode.

In recent semiconductor devices, a Shallow Trench Isolation (STI) method can be used in order to have more control over device isolation areas.

An example of a conventional semiconductor device having a pad electrode that uses STI method to form the device isolation area will now be illustrated with reference to FIGS. 1A and 1B.

FIG. 1A sets forth a plan view of a pad electrode of a conventional semiconductor device. FIG. 1B sets forth cross-sectional view of the pad electrode of FIG. 1A as viewed through the line A—A.

Referring now to FIGS. 1A and 1B, in the conventional semiconductor device a buried oxide film 51 having a thickness of 0.2 to 0.4 μm is formed on a p-type silicon substrate 50. Buried oxide 51 is formed in the pad electrode formation area using a STI method. Polycide 52 is formed on the buried oxide film 51. From FIG. 1A, it can be seen that polycide 52 is formed in a matrix with each square having sides of 4 μm length.

Interlayer film 53 is then formed on buried oxide film 53 and polycide film 52. A plurality of contact holes 54 having dimensions of 0.3 μm by 0.3 μm are formed in interlayer film 53. Each square polycide region 52 has twenty-five contact holes 54 arranged in five rows and five columns as can be seen in FIG. 1A. There are 14,400 contact holes 54 formed under the 100 μm square pad electrode 57.

Barrier film 55 comprising a layered Ti/TiN is formed on interlayer film 53 and within contact holes 54. A plug 56 comprising buried tungsten is then formed on the barrier film 55 in the contact holes 54. A pad electrode 57 comprising an AlCu film is formed on then formed on interlayer film 53 containing barrier film 55 and plug 56. Pad electrode 57 is a square having 100 μm sides and has a thickness of 0.5 to 0.6 μm.

As mentioned previously, in the conventional semiconductor device illustrated in FIGS. 1A and 1B, the buried oxide 51 is formed using a STI method. In the STI method, a trench having a depth of 0.2 to 0.4 μm is formed in p-type silicon substrate 50. An oxide film is then formed on the p-type silicon substrate 50 using a High Density Plasma (HDP) Chemical Vapor Deposition (CVD) method. The oxide film is then polished with a Chemical Mechanical Polis (CMP) to form buried oxide film 51 in the trench.

The CMP is performed over an about 100 μm wide square region. When CMP is performed over such a large area, uneven pressure distributions can cause "dishing" to occur by varying removal rates of selected material within the region during the CMP. "Dishing" can deteriorate the flatness of buried oxide film 51. If the pad electrode 57 is formed when "dishing" has occurred, there may be a 0.1 μm difference in the height between the center and an edge of the pad electrode 57.

If the surface of buried oxide film 51, which serves as a foundation for the pad formation, is uneven; the flatness of polycide 52 formed on buried oxide film 51 can also deteriorate. This can result in a further uneven configuration of contact holes 54 formed on polycide 52.

The bonding force between pad electrode 57 and interlayer film 53 can be reduced. This can result in stripping or peeling of the pad electrode 57.

If the thickness of pad electrode 57 is increased, stripping or peeling may be prevented. However, as discussed earlier, increasing the thickness of pad electrode 57 can reduce the etching accuracy of a wiring layer formed in the same process step as the pad electrode 57. Thus, minimum wiring geometries can be adversely affected.

Also, the conventional semiconductor device as illustrated in FIGS. 1A and 1B has a drawback in that when-the thickness of buried oxide film 51 is uneven, there may be thinner regions in which the breakdown voltage between pad electrode 57 and p-type silicon substrate 50 is reduced. This can cause electrostatic discharge (ESD) properties to deteriorate.

In view of the above discussion, it would be desirable to provide a semiconductor device in which a pad electrode can be resistant to peeling or stripping as compared to conventional approaches. Still further it would also be desirable to have improved ESD properties. It would also be desirable to have finer device fabrication capabilities.

SUMMARY OF THE INVENTION

According to the present embodiments, a semiconductor device having a pad formation region can include device isolation regions and impurity regions formed in an alternating pattern in the pad formation region on a semiconductor substrate. A conductor film can be formed on each device isolation region. An interlayer film can be formed on the conductor film and impurity regions. The interlayer film may have contact holes over the conductor film. A conductive plug may be formed in the contact holes. A pad electrode can be formed on the interlayer film and can be electrically connected with the conductor film through the second conductor film.

According to one aspect of the embodiments, a fabrication method of the semiconductor device may prevent a pad electrode from peeling caused by stresses when bonding.

According to another aspect of the embodiments, the semiconductor device may have higher ESD resistance.

According to another aspect of the embodiments, the device isolation regions can be made planar with a chemical mechanical polish method.

According to another aspect of the embodiments, the device isolation regions and the impurity regions can form a checkered pattern.

According to another aspect of the embodiments, the device isolation regions and the impurity regions can form a striped pattern.

According to another aspect of the embodiments, a plurality of contact holes may be formed over each conductor film. The contact holes may be arranged in rows and columns.

According to another aspect of the embodiments, only one contact hole may be formed over each conductor film.

According to another aspect of the embodiments, the device isolation region can be formed using a shallow trench isolation method.

According to another aspect of the embodiments, the semiconductor substrate can be doped with an impurity conductivity type and the impurity region can be doped with a higher concentration of the same impurity conductivity type.

According to another aspect of the embodiments, semiconductor substrate has a p-type doping and the impurity region is a p-type diffusion region.

According to another aspect of the embodiments, the conductor film formed on each device isolation region can be polycide.

According to another aspect of the embodiments, the plugs can be tungsten having a barrier layer underneath.

According to another aspect of the embodiments, the pad electrode can be AlCu.

According to another aspect of the embodiments, the pad electrode can be AlCu having a thickness of less than or equal to 0.4 $\mu$m. During the step of forming the pad electrode, signal conducting lines may be formed. The signal conducting lines can be AlCu and can have a minimum width of less than or equal to 0.4 $\mu$m.

According to another aspect of the embodiments, the insulating film can be formed in the same step as a device isolation region of a transistor.

According to another aspect of the invention, forming the contact holes can include forming a contact hole in a region of the semiconductor device that includes a transistor. A plug can fill the contact hole to form a electrical connection to the control gate of the transistor.

DETAILED DESCRIPTION OF THE EMBODIMENTS

Various embodiments of the present invention will now be described in detail with reference to a number of drawings.

A semiconductor device incorporating the present embodiments can include an active region where circuit components can be formed on a p-type silicon substrate. The semiconductor device can include a pad electrode formation region on which a pad electrode can be formed. The pad electrode can be a square having sides of about 100 $\mu$m. The pad electrode can be electrically connected to selected circuit components. A bonding wire can be electrically connected to the pad electrode to provide an electrical connection from selected circuit components to external devices (for example, through a lead frame and circuit board connections).

An embodiment will now be described with reference to FIGS. 2A and 2B.

Figure 1A:
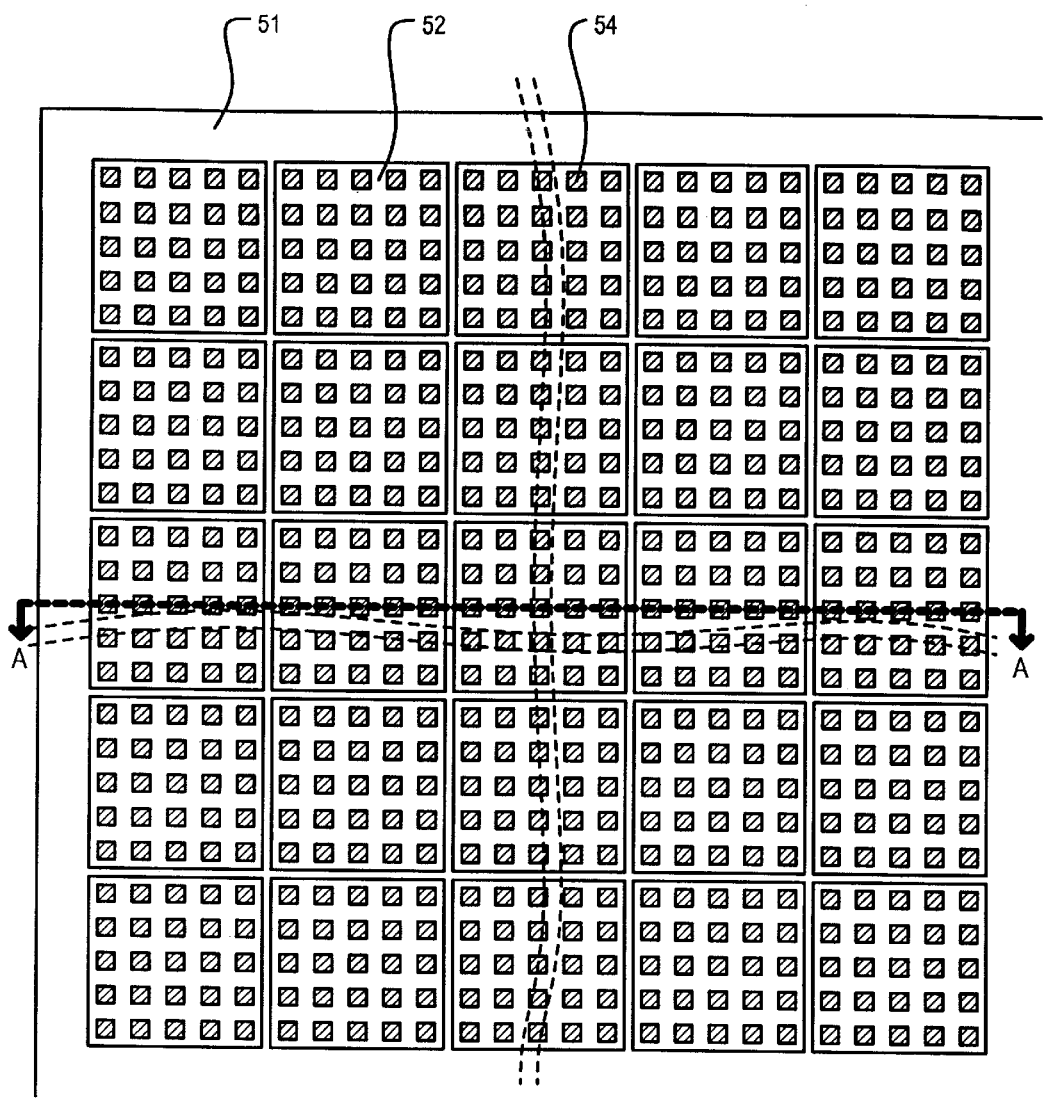
FIG. 1A is a plan view of a pad electrode of a conventional semiconductor device.
Figure 1B:
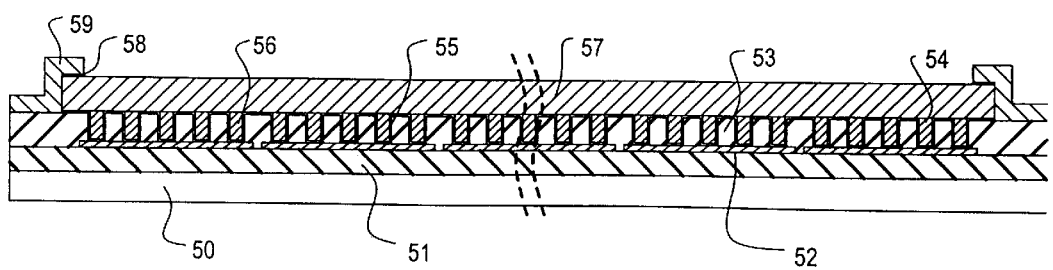
FIG. 1B is a cross-sectional view of the pad electrode of FIG. 1A as viewed through the line A—A.
Figure 2A:
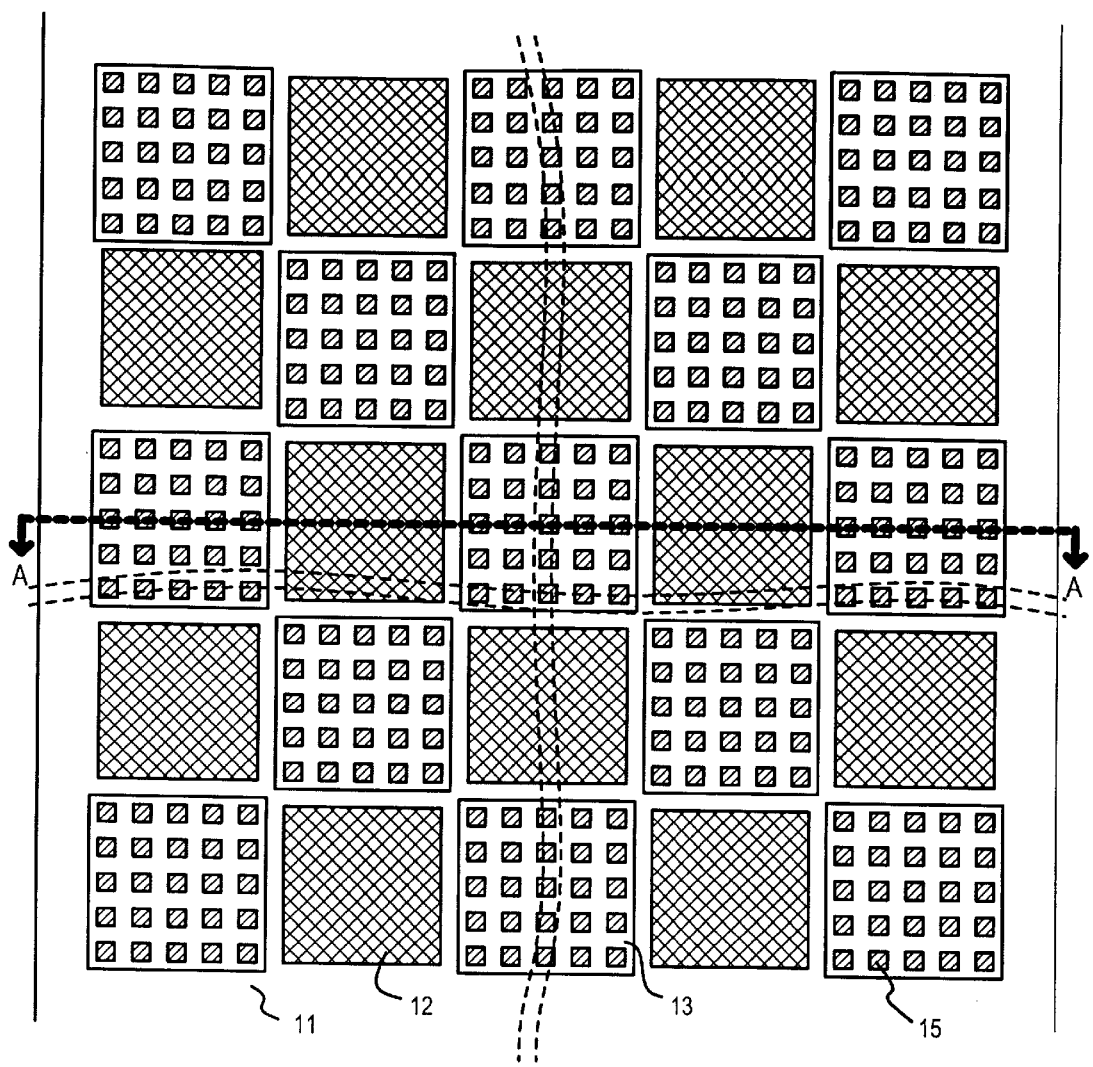
FIG. 2A is a plan view of a pad electrode of a semiconductor device according to an embodiment.

FIG. 2A sets forth a plan view of a pad electrode of a semiconductor device according to an embodiment. FIG. 2B sets forth cross-sectional view of the pad electrode of FIG. 2A as viewed through the line A—A.

Figure 2B:
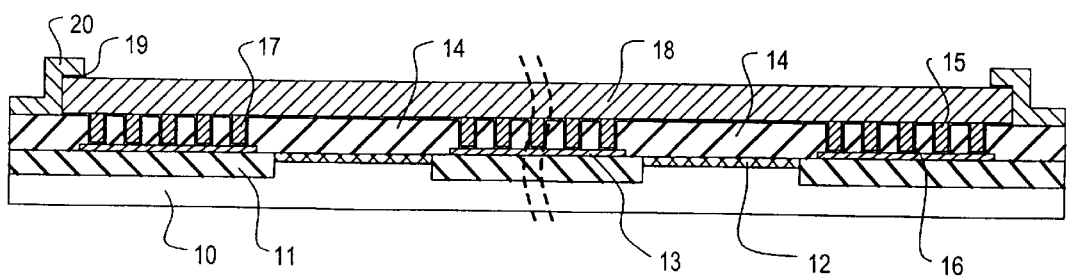
FIG. 2B is a cross-sectional view of the pad electrode of FIG. 2A as viewed through the line A—A.

Referring now to FIG. 2B, a buried oxide film 11 can be formed in a surface region of p-type silicon substrate 10. Buried oxide film 11 can be formed using the previously described STI method and can be used as a device isolation region. A dummy diffusion layer 12 can be formed in the pad electrode formation region. Dummy diffusion layer 12 can be P+ conductivity. Each dummy diffusion layer 12 formed in pad electrode region can be a square having approximately 3 $\mu$m sides. As illustrated in FIG. 2A, buried oxide film 11 and dummy diffusion layer 12 can be formed alternately in a checkered pattern.

Polycide 13 can be formed on buried oxide film 11. Polycide 13 can be a three layered structure comprising silicon oxy-nitride (SiON) having a thickness of approximately 35 nanometers (nm), tungsten silicide (WSi) having a thickness of approximately 130 nm, and polysilicon having a thickness of approximately 100 nm. Each polycide 13 formed in pad electrode region can be a square having approximately 4 µm sides.

Interlayer film 14 can be formed on buried oxide film 11, dummy diffusion layer 12, and polycide 13. Interlayer film 14 can be a laminated film of non-doped oxide having a thickness of approximately 100 nm, borophosphosilicate glass (BPSG) having a thickness of approximately 400 nm, and non-doped oxide having a thickness of approximately 25 nm.

Contact holes 15 can be formed on interlayer film 14. Contact holes 15 can have a dimension of approximately 0.3 µm×0.3 µm. Contact holes 15 can be formed above polycide 13. As illustrated in FIG. 2A, twenty-five contact holes 15 can be arranged in five rows and five columns above each square of polycide 13. The total number of contact holes 15 in the approximately 100 µm square pad electrode formation region can be 6,625.

Barrier film 16 can be formed on interlayer film 14 and inside contact holes 15. Barrier film can be a 2 layer structure comprising titanium (Ti) having a thickness of approximately 60 nm and titanium nitride (TiN) having a thickness of approximately 100 nm. Plug 17 can then be formed in contact holes 15. Plug 17 can be buried tungsten (W).

Pad electrode 18 can be formed on barrier film 16 and plug 17. Pad electrode 18 can comprise an aluminum-copper (AlCu) film having a thickness of about 0.3 to 0.6 µm.

Process steps of a method for forming pad electrode 18 illustrated in FIGS. 2A and 2B will now be described.

A pad oxide film having a thickness of about 5 nm can be formed on p-type silicon substrate 10. A mask nitrided film having a thickness of about 115 nm can then be formed on p-type silicon substrate 10. A photoresist film can then be applied onto the mask nitrided film. The resist film can have a predetermined pattern formed by an exposure and development process.

Patterned resist film can then be used as a mask and exposed mask nitrided film, pad oxide film, and p-type silicon substrate 10 can then be dry-etched. A trench having a depth (recess) of 0.2 to 0.4 µm can be aformed in the p-type silicon substrate 10 in a checkered pattern.

Resist film can then be removed and an oxide film can be formed on p-type silicon substrate 10. The oxide film can be formed using a high density plasma chemical vapor deposition (HDP-CVD) method. In this manner the trench can be buried. Next, CMP can be performed using the pad oxide film as a stopper. In this manner, buried oxide film 11 can be formed in a checkered pattern on the surface of p-type silicon substrate 10.

Because buried oxide film 11 can be formed in a checkered pattern, dishing may be prevented from occurring even if the CMP is performed in a wide region where pad electrode 18 is to be formed. The surface of buried oxide film 11 can be made relatively flat, and the thickness of the buried oxide film 11 can be relatively uniform.

The pad oxide film and mask nitrided film can then be removed by wet-etching. At this point, there can be an unevenness in the surface corresponding to the total film thickness of the pad oxide film and mask nitrided film. However, such an unevenness may not create problems in further processing steps.

The process described above can be carried out in the same process as the formation of a device isolation region of an internal circuit (not shown) in an active region (not shown) on p-type silicon substrate 10.

After the formation of buried oxide film 11, an SiON layer having a thickness of approximately 35 nm, a WSi film having a thickness of approximately 130 nm, and a polysilicon film having a thickness of approximately 100 nm can be formed in succession on p-type silicon substrate 10 by using sputtering or the like. Photoresist can then be applied, and a predetermined resist film pattern can then be formed by exposure and development process.

SiOn, WSi, and polysilicon films can then be etched using the resist film as a mask. Polycide 13 can then be formed on buried oxide film 11. Polycide 13 can be a square having a 4 µm width. The resist film can then be removed.

Similarly to the process for forming buried oxide film 11, the process for forming polycide 13 can be carried out in the same process as that for forming a gate electrode of a transistor and/or word lines in an internal circuit (not shown) on p-type silicon substrate.

P-type silicon substrate 10 can then be implanted with boron ions using buried oxide film 11 and polycide 13 as a mask. In this manner, dummy diffusion layer 12 can be formed on the surface region of p-type substrate 10 in areas in which there is no buried oxide film 11. In this manner, boron ions can be implanted into dummy diffusion layer 12 to form a checkered pattern with respect to the buried oxide film 11.

P+ dummy diffusion layer 12 may be formed in order to prevent a floating impurity density from being formed on p-type silicon substrate 10 in regions where there is no buried oxide film 11 in a subsequent ion implantation step (a subsequent process step performed in order to form a source-drain regions of active devices). Thus, P+ dummy diffusion layer 12 is formed on p-type silicon substrate 10 by implantation with boron ions such that P+ dummy diffusion layer 12 can have the same conductivity type as p-type silicon substrate 10.

Next, a resist film can be formed and patterned. The resist film can be used as a mask for an ion implantation step to form source-drain regions for internal circuit devices. Thereafter, the resist film may be removed.

Then an interlayer film 14 comprising a laminated film of non-doped oxide having a thickness of approximately 100 nm, BPSG having a thickness of approximately 400 nm, and non-doped oxide having a thickness of approximately 25 nm can be formed on p-type silicon substrate. Interlayer film 14 may also function as an interlayer film for a Metal Oxide Semiconductor (MOS) transistor.

Photoresist may then be applied on interlayer film 14. A resist film having a predetermined pattern can be formed by exposure an development process.

Interlayer film 14 can be etched using patterned resist film as a mask, thus forming contact holes 15 to polycide 13. Contact holes 15 having dimensions of 0.3 µm by 0.3 µm. It can be noted that other contact holes may also be formed in interlayer film in other areas of the semiconductor device than illustrated in FIGS. 2A and 2B. These other contact holes can be used to allow electrical connections through interlayer film 14 to gate electrodes of MOS transistors (not shown) in areas of the semiconductor device that contain circuit components.

Next, the resist film may be removed and barrier film 16 having a 2 layer structure comprising titanium (Ti) having a thickness of approximately 60 nm and titanium nitride (TiN) having a thickness of approximately 100 nm can be formed on p-type silicon substrate 10. In this manner, barrier film 16 can be formed on interlayer film 14 and in contact holes 15.

Then, a tungsten layer can be formed on p-type silicon substrate 10 using a CVD method or the like. CMP may then be carried out using barrier film 16 as a stopper. In this manner, plug 17 comprising buried tungsten can be formed in contact holes 15.

An AlCu film having a thickenss of 0.3 to 0.6 $\mu$m may then be formed on p-type substrate using a CVD method or the like. Then, an anti-reflection film 19 can be formed on the AlCu film. Anti-reflection film 19 can be a TiN film having a thickness of 25 nm. Anti-reflection film 19 can prevent exposure light from being reflected onto the AlCu film during the patterning step performed on the AlCu film.

Next, photoresist can be applied on anti-reflection film 19. A predetermined resist film pattern may then be formed by exposure and development process. In this manner, exposed portions of AlCu film and anti-reflection film 19 can be etched using the predetermined resist film pattern as a mask.

Passivation film (oxide film) 20 may then be formed as a protective film over the entire surface of p-type silicon substrate 10. A photoresist can be applied on passivation film. A predetermined resist film pattern may then be formed by exposure and development process. Exposed portions of passivation film and anti-reflection film 19 on AlCu film can be etched using the predetermined resist film pattern as a mask. In this manner, a square opening having a width of 100 $\mu$m can be formed on AlCu film. Thus, pad electrode 18 can be formed.

In the embodiment described above, dishing can be reduced by forming buried oxide film 11 in a checkered pattern. A stable and/or more planar foundation can be obtained on the surface of the region where plugs 17 and pad electrode can be formed.

As a result, the bonding force between pad electrode 18 and interlayer film 14 can be increased to reduce the likelihood of peeling. In this manner, peeling of the pad electrode 18 can be reduced even when the pad electrode has a thickness of approximately 0.3 $\mu$m. This can enable finer or smaller geometries to be produced on the semiconductor device.

Because, in the embodiment described above, buried oxide film 11 can have a more uniform thickness, an insulation voltage between p-type semiconductor substrate 10 and pad electrode 18 can be improved as compared to conventional semiconductor devices having a less-uniform thickness of an insulation film. This can improve the ESD resistance.

An embodiment will now be described with reference to FIGS. 3A and 3B.

Figure 3A:
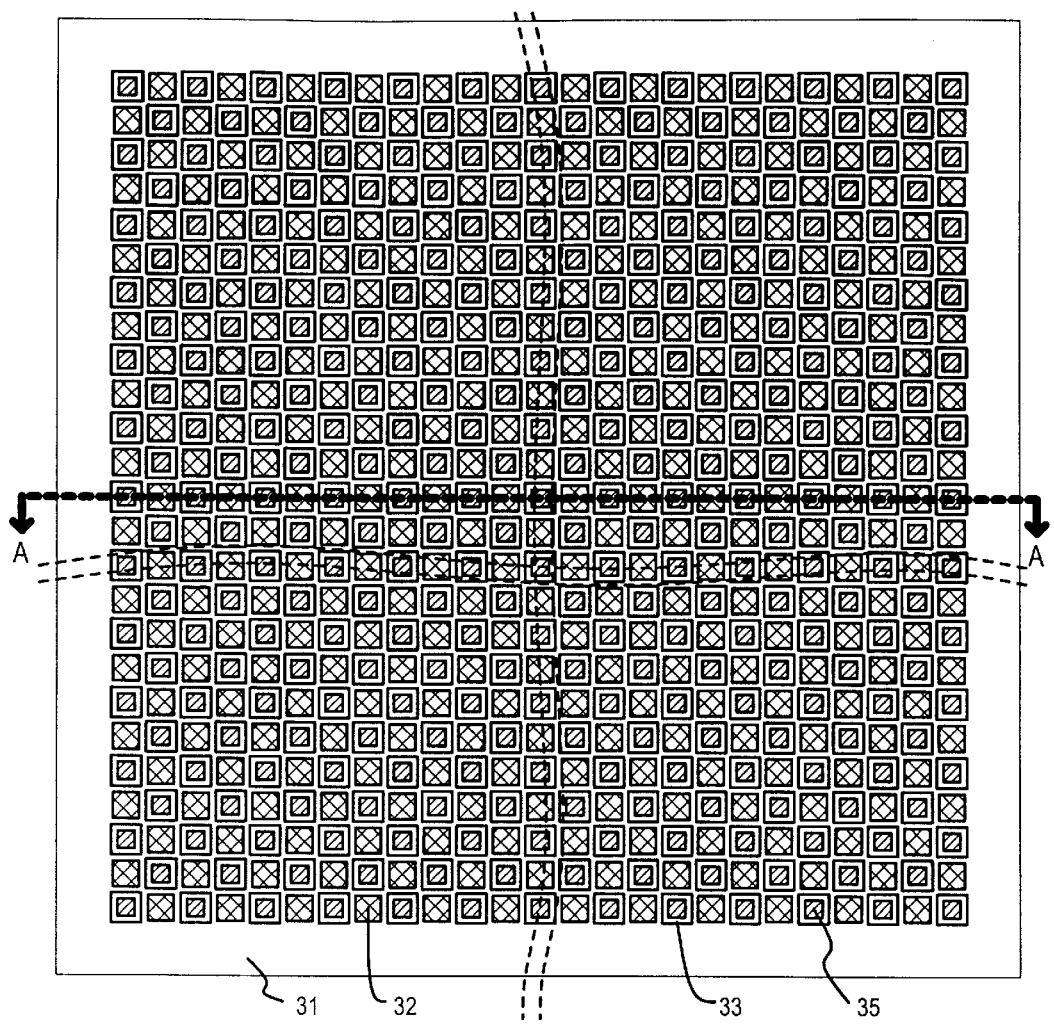
FIG. 3A is a plan view of a pad electrode of a semiconductor device according to an embodiment.

FIG. 3A sets forth a plan view of a pad electrode of a semiconductor device according to an embodiment. FIG. 3B sets forth cross-sectional view of the pad electrode of FIG. 3A as viewed through the line A—A.

Figure 3B:
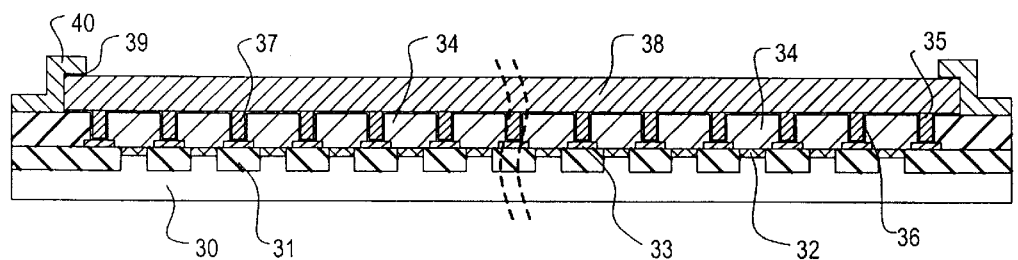
FIG. 3B is a cross-sectional view of the pad electrode of FIG. 3A as viewed through the line A—A.

Referring now to FIG. 3B, a buried oxide film 31 can be formed in a surface region of p-type silicon substrate 30. Buried oxide film 31 can be formed using the previously described STI method and can be used as a device isolation region. A dummy diffusion layer 32 can be formed in the pad electrode formation region. Dummy diffusion layer 32 can be P+ conductivity. As illustrated in FIG. 3A, buried oxide film 31 and dummy diffusion layer 32 can be formed alternately in a checkered pattern.

Polycide 33 can be formed on buried oxide film 31. Polycide 33 can be a three layered structure comprising SiON having a thickness of approximately 35 nm, WSi having a thickness of approximately 130 nm, and polysilicon having a thickness of approximately 100 nm.

In the semiconductor device according to the embodiment as illustrated in FIGS. 3A and 3B, buried oxide film 31 having polycide 33 formed thereon can form an alternate checkered pattern with respect to dummy diffusion layer 32.

As illustrated in FIG. 3B, interlayer film 34 can be formed on buried oxide film 31, dummy diffusion layer 32, and polycide 33. Interlayer film 34 can be a laminated film of non-doped oxide having a thickness of approximately 100 nm, BPSG film having a thickness of approximately 400 nm, and non-doped oxide having a thickness of approximately 25 nm.

Contact holes 35 can be formed on interlayer film 34. Contact holes 35 can have a dimension of approximately 0.3 $\mu$m×0.3 $\mu$m. As illustrated in FIG. 3A, a contact hole 35 can be formed above each region of polycide 33.

It can be noted that in the embodiment of FIG. 3A and FIG. 3B, a single contact hole 35 can be formed on each region of polycide 33. The sizes of polycide 33 and buried oxide film 31 can be restricted to the minimum. P+ dummy diffusion layer 32 can thus be reduced to the necessary minimum.

Barrier film 36 can be formed on interlayer film 34 and inside contact holes 35. Barrier film can be a 2-layer structure comprising Ti having a thickness of approximately 60 nm and TiN having a thickness of approximately 100 nm. Plug 37 can then be formed in contact holes 35. Plug 37 can be buried tungsten. Pad electrode 38 can be formed on barrier film 36 and plug 37. Pad electrode 38 can comprise an aluminum-copper (AlCu) film having a thickness of about 0.3 to 0.6 $\mu$m. Pad electrode 38 can be surrounded by anti-reflection film 39 and passivation film 40.

The pad electrode in the embodiment of FIGS. 3A and 3B can be formed using the same general process steps as the pad electrode in the embodiment of FIGS. 2A and 2B.

In the embodiment of FIGS. 3A and 3B, a single contact hole 35 can be formed above each region of polycide 33. This can allow the size of P+ dummy diffusion layer 32 to be reduced. This can prevent an electrically unstable diffusion region from being formed on the surface of p-type semiconductor substrate 30 in the pad electrode formation region.

Because the interval between adjacent contact holes 35 can be uniform throughout the pad electrode formation region, the bonding force between p-type silicon substrate 30 and pad electrode 38 can be made uniform.

It is understood that the embodiments described above are exemplary and the present invention should not be limited to those embodiments. For example, in the embodiment of FIGS. 3A and 3B, buried oxide film 31 can be formed in a checkered pattern alternately with dummy diffusion layer 32 and the buried oxide film 31 may have a size in which dishing may not occur. The checkered configuration and size should not be limited to the values described above.

Similar effects as those of the embodiments could be obtained when buried oxide film and dummy diffusion layer are formed in a striped shape configuration. In this case, on the striped shape configuration, polycide can be formed on the buried oxide film. Contact holes may be formed along each strip of polycide in one or two rows, as just two examples. Pad electrode may then be formed thereon.

Semiconductor materials, sizes, shapes and/or thickness used in the embodiments are for examples and can be arbitrary. For example, it is understood that photolithography steps may round off corners. The embodiments can be used in a wide range of semiconductor processes and technology.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor device, comprising: a semiconductor substrate;

device isolation regions being formed in indentations in the semiconductor substrate;

impurity regions on the semiconductor substrate forming a checkered pattern with the device isolation regions;

a first conductor film formed on each device isolation region;

an interlayer film formed on the first conductor film and impurity regions, the interlayer film having an opening to the first conductor film;

a second conductor film formed in the opening; and a pad electrode, for providing an external electrical connection, formed on the interlayer film and electrically connected with the first conductor film through the second conductor film.

2. The semiconductor device of claim 1, wherein a plurality of openings are formed to each first conductor film.

3. The semiconductor device of claim 1, wherein only one opening is formed to each first conductor film.

4. The semiconductor device of claim 1, wherein the device isolation region is formed using a shallow trench isolation method.

5. The semiconductor device of claim 1, wherein: the semiconductor substrate is doped with an impurity conductivity type; and the impurity region is doped with a higher concentration of the impurity conductivity type than the semiconductor substrate.

6. The semiconductor device of claim 1, wherein: the first conductor film includes polycide; the second conductor film includes tungsten; and the pad electrode includes aluminum.

7. The semiconductor device of claim 1, wherein: impurity regions formed on the semiconductor substrate form a striped pattern with the device isolation regions.

* * * * *